(12) United States Patent
Cho

(10) Patent No.: US 8,675,368 B2
(45) Date of Patent: Mar. 18, 2014

(54) VERTICALLY ORIENTED SEMICONDUCTOR DEVICE AND SHIELDING STRUCTURE THEREOF

(75) Inventor: Hsiu-Ying Cho, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 227 days.

(21) Appl. No.: 13/212,987

(22) Filed: Aug. 18, 2011

(65) Prior Publication Data
US 2013/0044455 A1  Feb. 21, 2013

(51) Int. Cl.
  H05K 7/00   (2006.01)
  H01L 27/08  (2006.01)
  H01L 21/31  (2006.01)

(52) U.S. Cl.
  USPC ............................ 361/777; 257/531; 438/765

(58) Field of Classification Search
  USPC ............................ 257/531; 438/765; 361/777
  See application file for complete search history.

(56) References Cited

U.S. PATENT DOCUMENTS

| | | | |
|---|---|---|---|
| 6,031,445 A | 2/2000 | Marty et al. | |
| 6,383,858 B1 | 5/2002 | Gupta et al. | |
| 6,743,671 B2 | 6/2004 | Hu et al. | |
| 6,833,781 B1 | 12/2004 | Padmanabhan et al. | |
| 7,485,912 B2 | 2/2009 | Wang | |
| 2003/0127704 A1* | 7/2003 | Kobayashi et al. | 257/531 |
| 2004/0251978 A1* | 12/2004 | Muramatsu et al. | 331/117 R |
| 2006/0163692 A1* | 7/2006 | Detecheverry et al. | 257/531 |
| 2007/0052062 A1* | 3/2007 | Ding et al. | 257/528 |
| 2007/0235838 A1* | 10/2007 | Wang | 257/532 |
| 2008/0237789 A1* | 10/2008 | He et al. | 257/531 |
| 2009/0322447 A1* | 12/2009 | Daley et al. | 333/185 |
| 2010/0141354 A1* | 6/2010 | Cho | 333/160 |
| 2010/0214041 A1 | 8/2010 | Cho | |
| 2010/0301987 A1 | 12/2010 | Belot et al. | |
| 2011/0001504 A1* | 1/2011 | Cho et al. | 324/756.01 |

OTHER PUBLICATIONS

Unpublished U.S. Appl. No. 13/272,866, filed Oct. 13, 2011 entitled "Vertically Oriented Semiconductor Device and Shielding Structure Thereof," 38 pages.
Unpublished U.S. Appl. No. 13/158,044, filed Jun. 10, 2011 entitled "A Vertical interdigitated Semiconductor Capacitor," 33 pages.
Unpublished U.S. Appl. No. 13/280,786, filed Oct. 25, 2011 entitled "Structure and Method for a High-K Transformer with Capacitive Coupling," 39 pages.
Unpublished U.S. Appl. No. 13/227,242, filed Sep. 7, 2011 entitled "A Horizontal Interdigitated Capacitor Structure with Vias," 44 pages.

(Continued)

Primary Examiner — Long K Tran
Assistant Examiner — Dzung Tran
(74) Attorney, Agent, or Firm — Haynes and Boone, LLP

(57) ABSTRACT

The present disclosure involves a semiconductor device. The semiconductor device includes a substrate. The semiconductor device includes an electronic device positioned over the substrate. The electronic device includes an opening. The semiconductor device includes a shielding device positioned over the substrate and surrounding the electronic device. The shielding device includes a plurality of elongate members. A subset of the plurality of elongate members extend through the opening of the electronic device. At least one of the electronic device and the shielding device is formed in an interconnect structure positioned over the substrate.

20 Claims, 16 Drawing Sheets

(56) References Cited

OTHER PUBLICATIONS

Kawano, Yoichi, et al., "A 77GHz Transceiver in 90nm CMOS," 2009 IEEE International Solid-State Circuits Conference, 978-1-4244-3457-2/09, ISSCC 2009/Session 18/Ranging and Gb/s Communication/18.3, 3 pages.

Lim, Chee Chong, et al., "Fully Symmetrical Monolithic Transformer (True 1:1) for Silicon RFIC," IEEE Transactions on Microwave Theory and Techniques, vol. 56, No. 10, Oct. 2008, pp. 2301-2311.

Unpublished U.S. Appl. No. 13/212,982, filed Aug. 20, 2011 entitled "Vertically Oriented Semiconductor Device and Shielding Structure Thereof," 44 pages.

Unpublished U.S. Appl. No. 13/212,976, filed Aug. 18, 2011 entitled "Vertically Oriented Semiconductor Device and Shielding Structure Thereof," 44 pages.

Unpublished U.S. Appl. No. 13/411,052, filed Mar. 2, 2012 entitled "Structure and Method for a Fishbone Differential Capacitor," 38 pages.

Non-Final Office Action dated Apr. 24, 2013 for U.S. Appl. No. 13/212,976 entitled "Vertically Oriented Semiconductor Device and Shielding Structure Thereof," 15 pages.

* cited by examiner

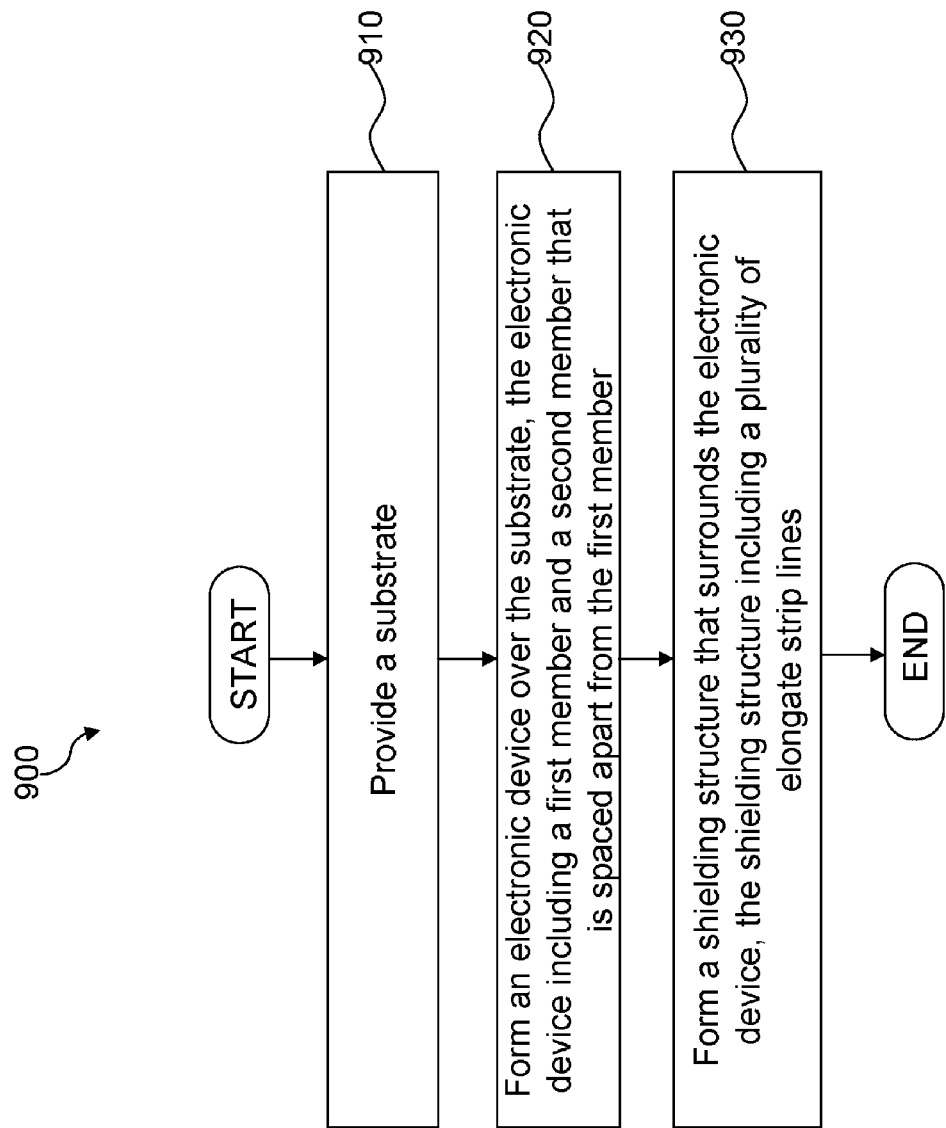

VERTICALLY ORIENTED SEMICONDUCTOR DEVICE AND SHIELDING STRUCTURE THEREOF

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Various active or passive electronic components can be formed on a semiconductor IC. For example, transformers, inductors, capacitors, etc, may be formed on a semiconductor IC. However, conventional electronic components formed on an IC may face shortcomings such as excess space consumption, poor device performance, inadequate shielding, and high fabrication costs.

Therefore, while existing electronic components on semiconductor ICs have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 14 is a flowchart illustrating a method of fabricating a shielding device according to an embodiment.

DETAILED DESCRIPTION

Figure 1A:
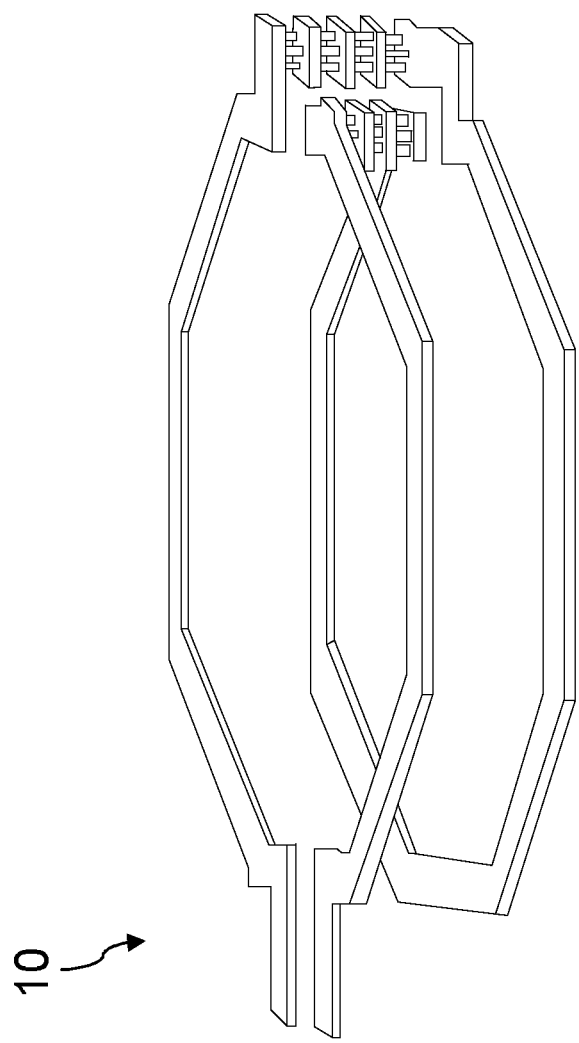
FIG. 1A illustrates a perspective view of an inductor device.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A transformer is an alternating current (AC) device that transforms voltages, currents, and impedances. It typically includes two or more coils coupled magnetically through a common core, for example a ferromagnetic core. Faraday's law of electromagnetic induction establishes the principle of operation of transformers.

Figure 1B:
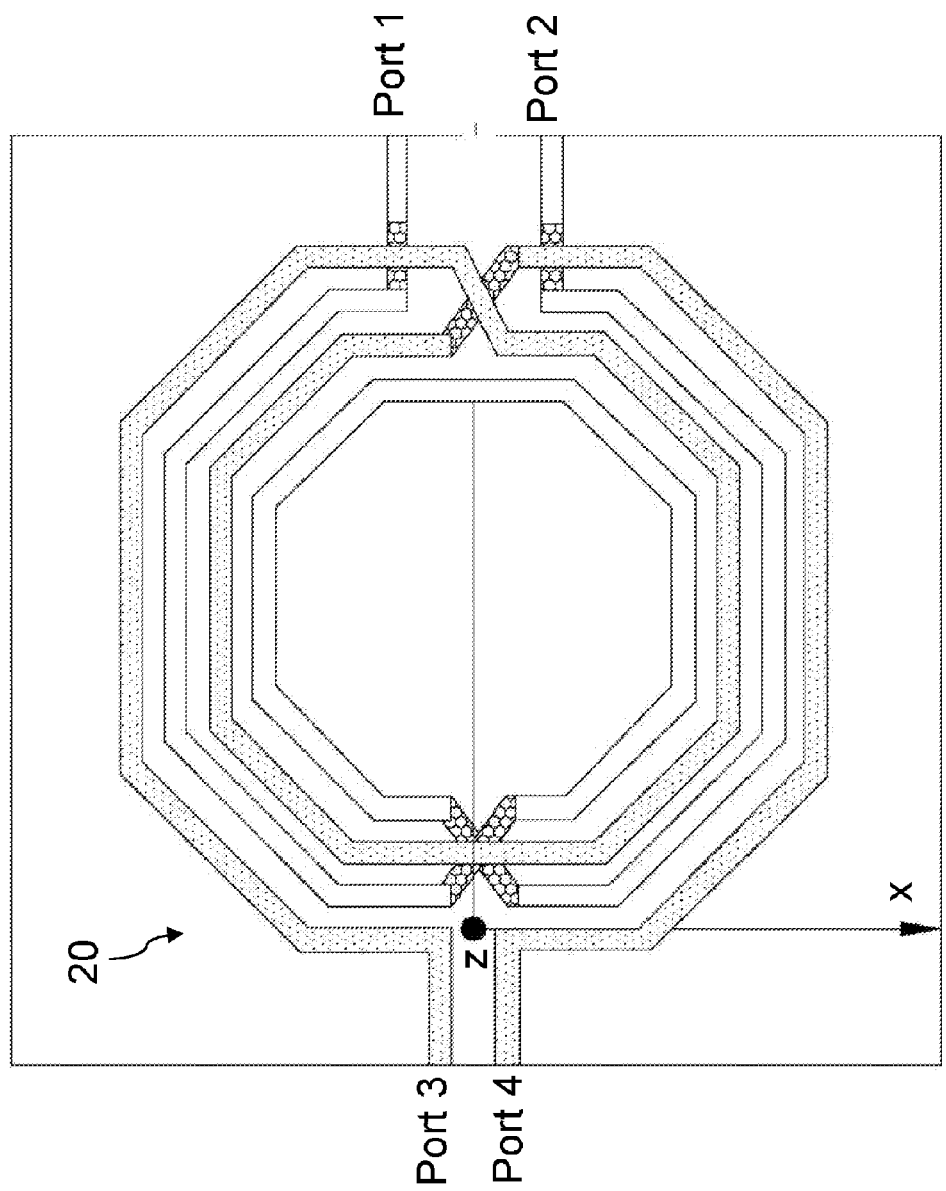
FIGS. 1B-1C illustrate a top view and a cross-sectional view of a transformer device.
Figure 1C:
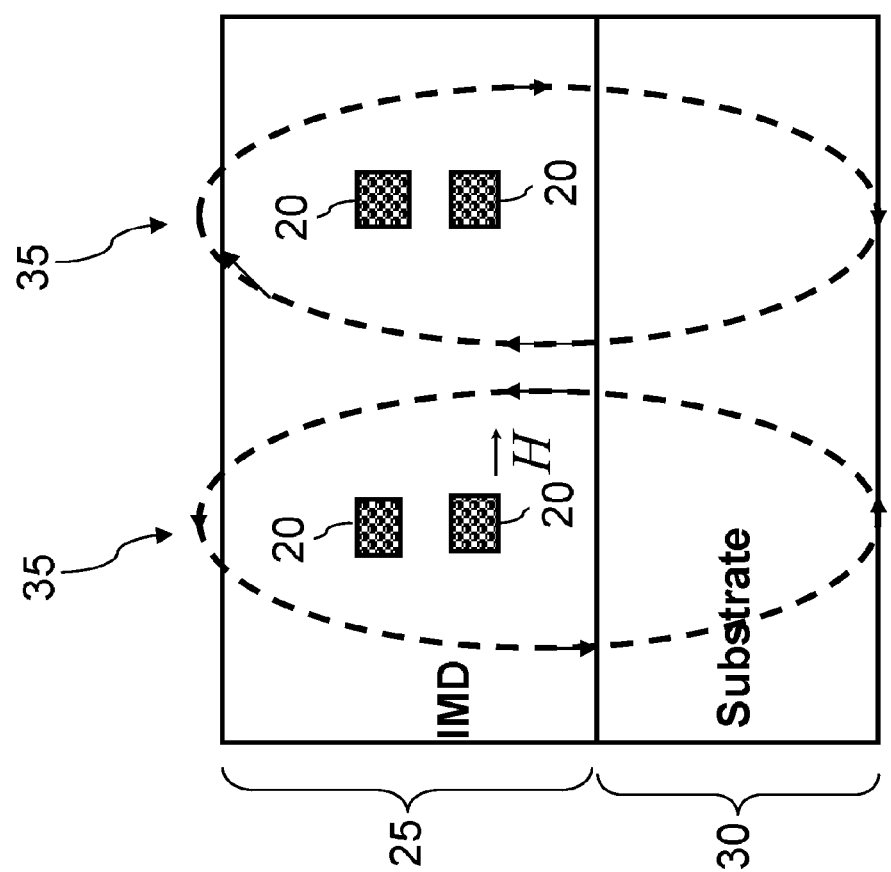

FIG. 1A is a perspective view of an inductor coil 10, and FIG. 1B is a top view of a transformer 20 that includes the inductor coil 10. The transformer 20 has a plurality of ports (ports 1-4 as illustrated herein) and includes conductive coils (or windings) that span a plurality of levels. When electric current flows through the conductive coils, a magnetic field is generated, which is shown in a cross-section view in FIG. 1C. Referring to FIG. 1C, the transformer 20 is implemented in an interconnect structure 25 which contains intermetal dielectric (IMD) and metal lines. The interconnect structure 25 is formed on a substrate 30, which may include a semiconductor material. The electric current flow in the transformer 20 generates a magnetic field 35, which extends into the substrate 30. According to Faraday's law of electromagnetic induction, an eddy current will be induced by the presence of the magnetic field 35. The eddy current is induced in the interconnect structure as well as in the substrate 30. Such eddy current leads to power loss, particularly at high frequencies. Thus, the performance of the transformer 20 is degraded. In addition, the coplanar-coupled coils of the transformer 20 as illustrated in FIG. 1B also entails inefficient use of chip area and a low coupling factor.

Figure 2:
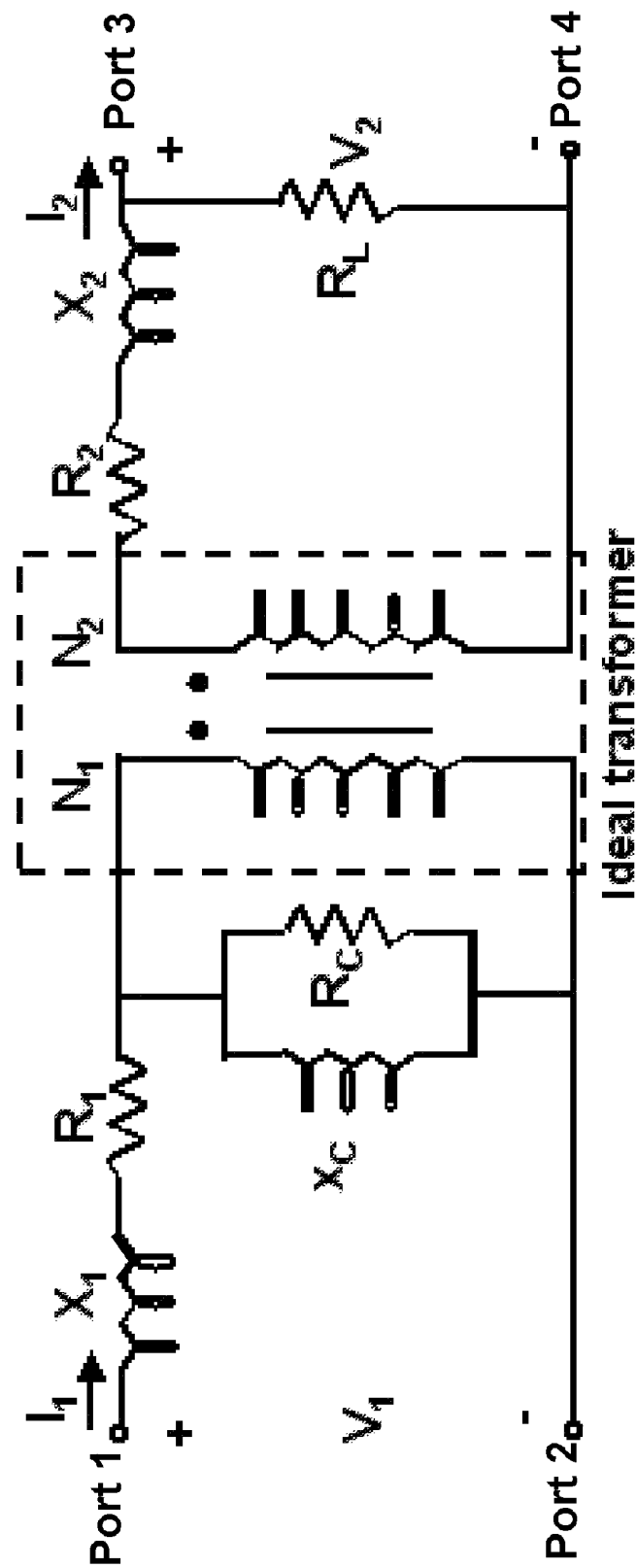
FIG. 2 is an equivalent circuit schematic of a transformer device.

In accordance with various aspects of the present disclosure, the following paragraphs will describe a transformer that overcomes the issues associated with the transformer 20. FIG. 2 is a schematic of an equivalent circuit of a transformer device. The transformer device includes a primary coil having ports 1-2 and a secondary coil having ports 3-4. Electrical connections to the primary and secondary coils can be established through ports 1-4. For example, a voltage $V_1$ is applied across the ports 1 and 2, and a voltage $V_2$ is induced across the ports 3 and 4, which is measured across a load $R_L$. A current $I_1$ is applied through port 1, and a current $I_2$ is induced at port 3.

$R_1$ and $R_2$ represent the winding resistances of the primary and secondary coils, respectively. The primary coil has $N_1$ number of windings or turns, and the secondary coil has $N_2$ number of windings or turns. For an ideal transformer (shown in the dashed box FIG. 2 as a device containing the primary and secondary coils, $I_1/I_2=N_2/N_1$, $V_1/V_2=N_1/N_2$, and $R_1=n(N_1/N_2)^2*R_L$.

However, for a non-ideal transformer, the existence of leakage flux, non-infinite inductances, non-zero windings resistance, and the presence of hysteresis and eddy-current loss need to be taken into account. For the transformer illustrated in FIG. 2, $X_1$ and $X_2$ represent the leakage inductive reactances of the primary and secondary coils, respectively. $R_C$ represents the power loss due to hysteresis and eddy-current effects. $X_C$ is a non-linear inductive reactance representing the nonlinear magnetization behavior of the ferromagnetic core. The following paragraphs will describe a transformer having reduced eddy-current losses and improved coupling factor according to various aspects of the present disclosure.

Figure 3:
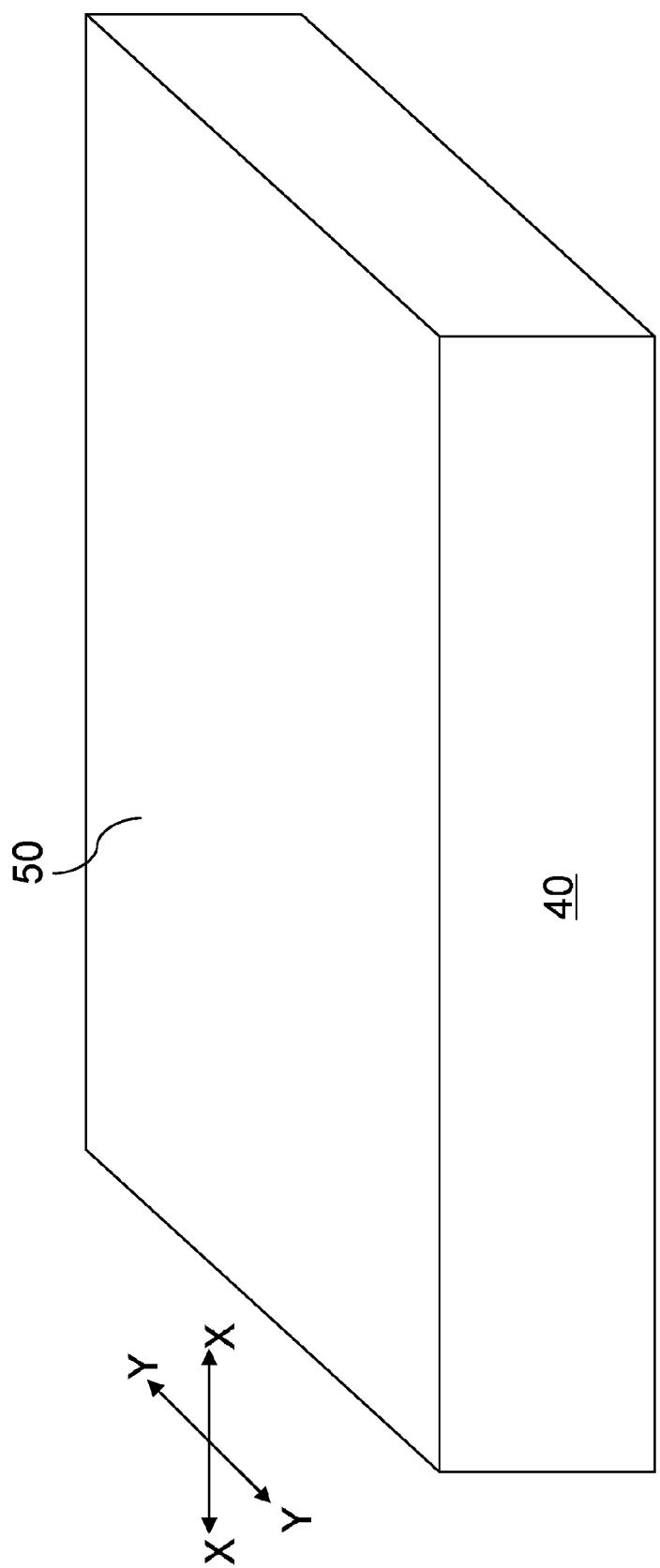
FIGS. 3-4 are perspective views of a semiconductor device at different stages of fabrication.

Referring to FIG. 3, a diagrammatic fragmentary perspective view of a semiconductor device is illustrated. The semiconductor device has a substrate 40. In one embodiment, the substrate 40 is a silicon substrate doped with either a P-type dopant such as boron, or doped with an N-type dopant such as arsenic or phosphorous. The substrate 40 may be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi layer), may be strained for performance enhancement, and may include a silicon-on-insulator (SOI) structure.

Although not specifically shown for the sake of simplicity, a plurality of electronic components may be formed in the substrate. For example, source and drain regions of FET transistor devices may be formed in the substrate. The source and drain regions may be formed by one or more ion implantation or diffusion processes. As another example, isolation structures such as shallow trench isolation (STI) structures or deep trench isolation (DTI) structures may be formed in the substrate to provide isolation for the various electronic components. These isolation structures may be formed by etching recesses (or trenches) in the substrate 40 and thereafter filling the recesses with a dielectric material, such as silicon oxide, silicon nitride, silicon oxy-nitride, fluoride-doped silicate (FSG), and/or a low-k dielectric material known in the art.

The substrate 40 has an upper surface 50. The surface 50 includes a two-dimensional plane that is defined by an X-axis and a Y-axis, where the X-axis and Y-axis are perpendicular, or orthogonal, to each other. The X-axis and the Y-axis may also be referred to as an X-direction and a Y-direction, respectively.

Figure 4:
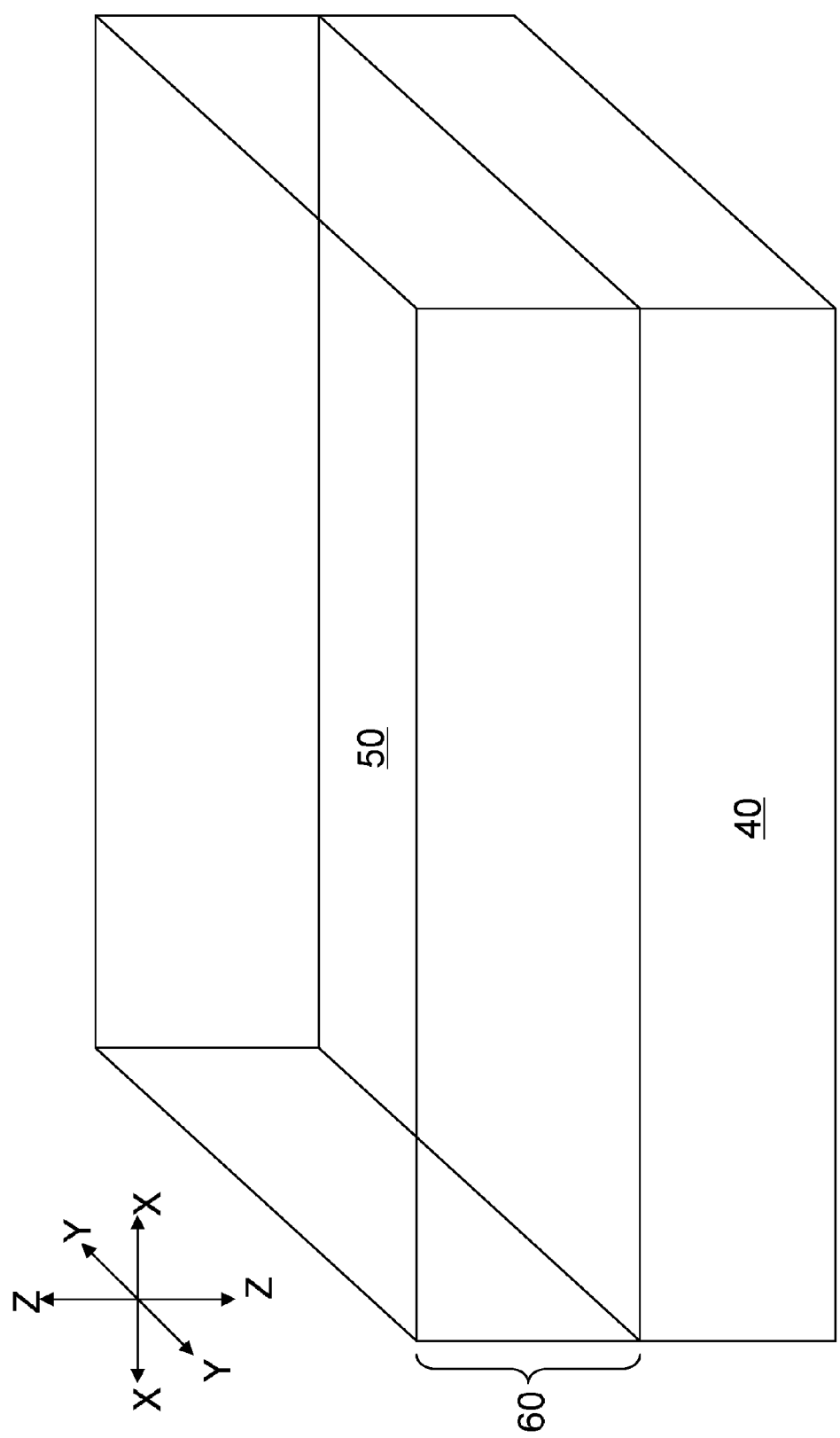

Referring now to FIG. 4, an interconnect structure 60 is formed over the upper surface 50 of the substrate 40. In other words, the interconnect structure 60 is disposed over the surface 50 in a Z-axis, or a Z-direction that is perpendicular to the surface 50. The interconnect structure 60 includes a plurality of patterned dielectric layers and interconnected conductive layers. These interconnected conductive layers provide interconnections (e.g., wiring) between circuitries, inputs/outputs, and various doped features formed in the substrate 40. In more detail, the interconnect structure 60 may include a plurality of interconnect layers, also referred to as metal layers (e.g., M1, M2, M3, etc). Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including physical vapor deposition (PVD), chemical vapor deposition (CVD), sputtering, plating, or combinations thereof.

The interconnect structure 60 includes an interlayer dielectric (ILD) that provides isolation between the interconnect layers. The ILD may include a dielectric material such as an oxide material. The interconnect structure 60 also includes a plurality of vias/contacts that provide electrical connections between the different interconnect layers and/or the features on the substrate. For the sake of simplicity, the metal lines in the interconnect layers, the vias interconnecting the metal lines, and the dielectric material separating them are not specifically illustrated herein.

According to various aspects of the present disclosure, a transformer is formed in the interconnect structure 60. Or stated differently, various components of the interconnect structure 60 constitute the transformer disclosed herein. The transformer is not shown in FIG. 4 for the sake of simplicity, but one of its various embodiments is illustrated in more detail in FIG. 5 and will be discussed in more detail by the following paragraphs.

Figure 5:
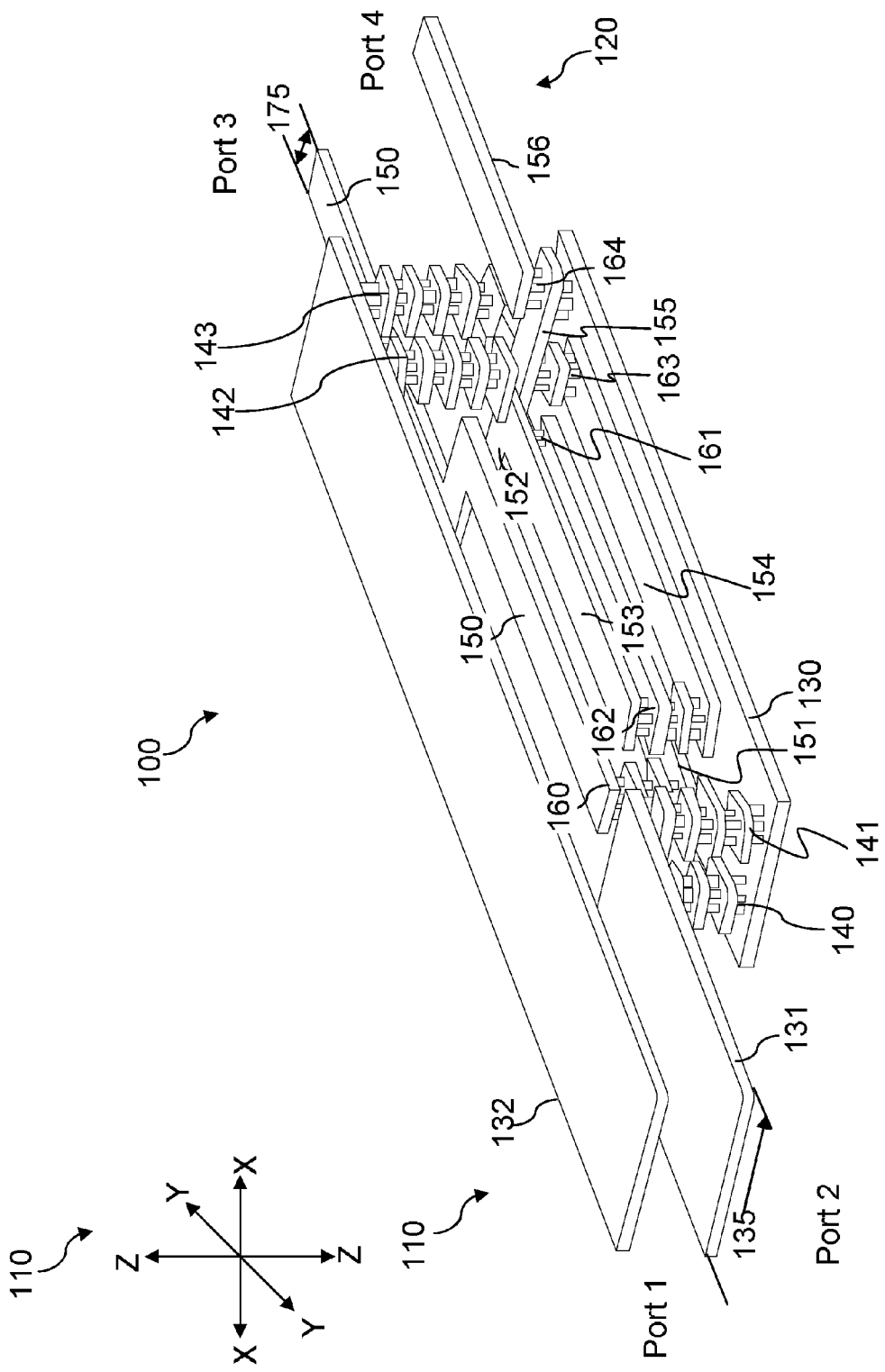
FIG. 5 is a perspective view of a transformer device according to an embodiment.

Referring now to FIG. 5, a fragmentary perspective view of an embodiment of a transformer 100 is illustrated according to aspects of the present disclosure. The transformer 100 includes a coil (or winding) 110 and a coil (or winding) 120. In one embodiment, the coil 110 is a primary coil, and the coil 120 is a secondary coil. In another embodiment, the coil 120 is a primary coil, and the coil 110 is a secondary coil. The coils 110 and 120 are separated by a dielectric material (e.g., ILD) of the interconnect structure 60.

As is the case with any transformer, the coils 110 and 120 each include a plurality of turns or windings. According to aspects of the present disclosure, these turns or windings are made up of a plurality of interconnect lines and vias of the interconnect structure 60 (shown in FIG. 4). For example, in the illustrated embodiment, the coil 110 includes interconnect lines 130-132, which belong to different interconnect layers. The interconnect lines 130-132 have elongate shapes and extend horizontally along an axis that is orthogonal to the Z-axis, which could be either the X-axis or the Y-axis. The interconnect lines 130-132 also have a width or a lateral dimension 135 that is measured horizontally along an axis that is perpendicular to the axis along which the interconnect lines 130-132 extend.

The interconnect lines 130 and 131 are interconnected together by via stacks 140 and 141. The interconnect lines 130 and 132 are interconnected together by via stacks 142 and 143. The via stacks 140-143 each extend along the Z-axis each include a plurality of vertically-aligned (along the Z-axis) vias and interconnect line components.

Similar to the coil 110, the coil 120 also includes a plurality of elongate interconnect lines that are interconnected by a plurality of via stacks. In the illustrated embodiment, the coil 120 includes interconnect lines 150-156 and via stacks 160-164. The interconnect lines 150-151 are interconnected together by via stack 160. The interconnect lines 151-152 are interconnected together by via stack 161 (whose view is partially obstructed). The interconnect lines 152-153 are interconnected together by a via stack whose view is obstructed in FIG. 5. The interconnect lines 153-154 are interconnected together by via stack 162. The interconnect lines 154-155 are interconnected together by via stack 163. The interconnect lines 155-156 are interconnected together by via stack 164.

In comparison to the coil 110, the interconnect lines of the coil 120 have substantially narrower widths. For example, the interconnect line 150 of the coil 120 has a width 175 that is measured along the same axis as the width 135. The width 135 is greater than the width 175 by a factor that is no less than two. For example, the width 135 may be two, three, or four times the width 175. Due at least in part to the smaller width 175, the coil 120 also has more windings or turns than the coil 110. Each winding may include its own subset of vertically-aligned interconnect lines and vias interconnecting these vertically-aligned interconnect lines. For example, one of these windings of the coil 120 includes the interconnect lines 150-151 and the via stack 160, and another one of these windings includes the interconnect lines 153-154 and the via stack 162. These two windings are disposed on planes that are substantially parallel to each other.

These planes of the windings of the coil 120 define a winding orientation of the coil 120. In a similar manner, the coil 110 also has a winding that includes the interconnect lines 130-132 and the via stacks 140-143. The winding of the coil 110 is disposed on a plane that is substantially parallel to the planes of the windings of the coil 120. These plans define a winding orientation or winding direction of the coils 110 and 120. Thus, it may be said that the coils 110 and 120 each have a winding orientation or a winding direction that intersects with (or is non-parallel to) the surface 50 (shown in FIG. 3) of the substrate 40. In other words, since the surface 50 is on a plane defined by the X-axis and the Y-axis, the winding orientation of the coils 110 and 120 is on a plane that intersects the plane defined by the X and Y axes. In an embodiment, the plane of the winding orientation of the coils 110 and 120 is partially defined by the Z-axis, which as discussed above is perpendicular or orthogonal to both the X axis and the Y axis.

In the illustrated embodiment, the coil 120 is implemented "within" the coil 110, in the sense that the interconnect lines of the coil 120 are disposed in interconnect layers that are in between the interconnect layers in which the interconnect lines of the coil 110 are disposed. Stated differently, the interconnect layers corresponding to the coil 110 may include M1 (in which the interconnect line 130 is implemented) and M7 (in which the interconnect line 132 is implemented). On the other hand, the interconnect layers corresponding to the coil 120 may include M2-M5, which are disposed in between the interconnect layers M1 and M7, wherein interconnect layers M2-M5 are disposed in between the layers M1 and M7. It is understood that these specific layers or numbers of layers are not intended to be limiting, and that the coils 110-120 may be implemented in other interconnect layers or include different numbers of interconnect lines and/or via stacks in alternative embodiments. Furthermore, it is understood that the coil 110 may be implemented "within" the coil 120 in other embodiments.

With reference to FIGS. 2 and 5, the distal portions of the interconnect lines 132 and 131 constitute ports 1 and 2 of the transformer 100, respectively, and the distal portions of the interconnect lines 150 and 156 constitute ports 3 and 4 of the transformer 100, respectively. Applying a voltage across ports 1 and 2 will induce a voltage across ports 3 and 4, and applying a current at port 1 will induce a current at port 3.

Figure 6:
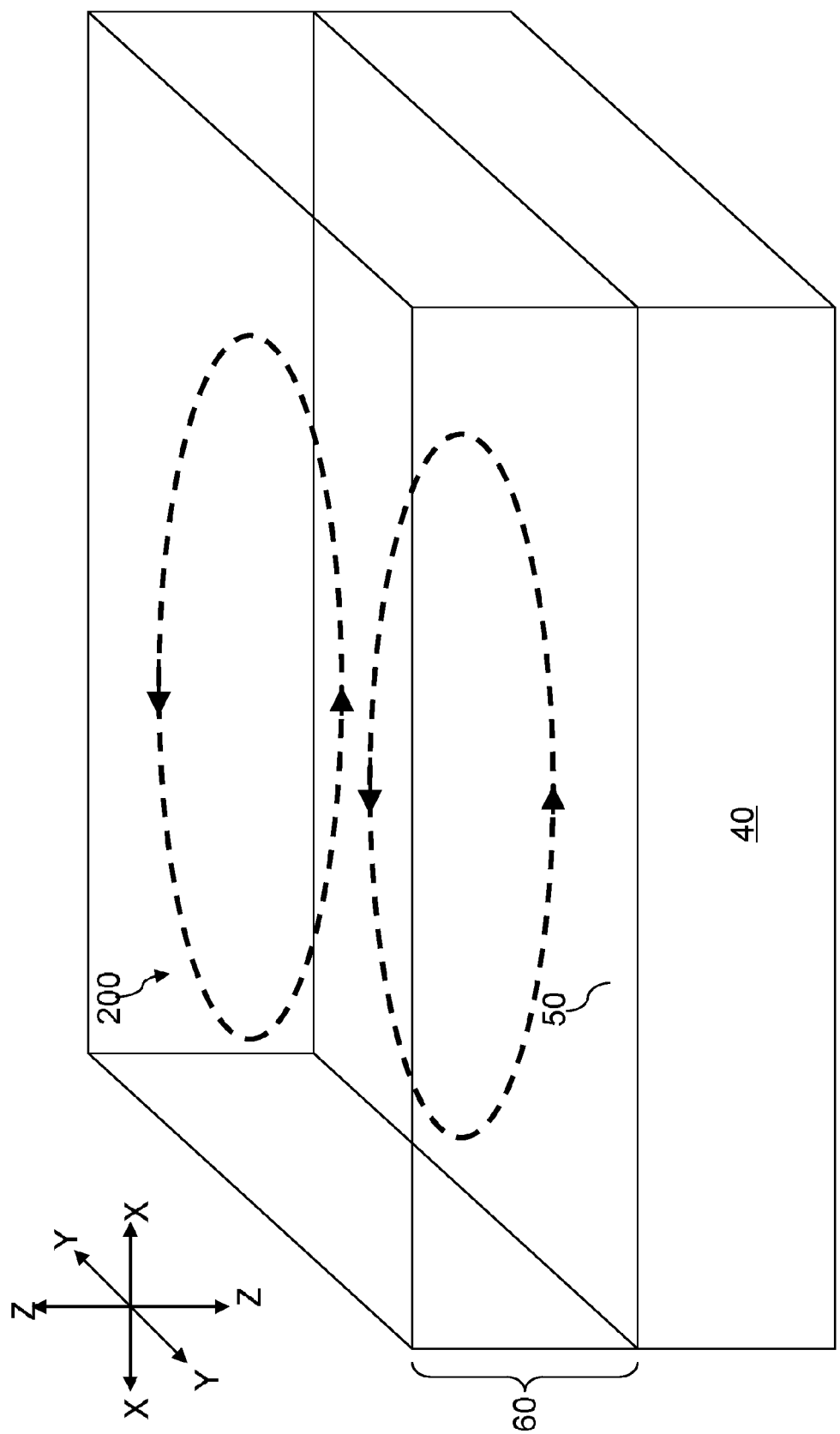
FIG. 6 is a perspective view of a semiconductor device in which the transformer device of FIG. 5 is implemented according to an embodiment.

Referring to FIG. 6, when the transformer 100 is powered on, a magnetic field 200 is generated by currents flowing through the coil 110. Another magnetic field will be induced, and the direction of that induced magnetic field is parallel to the magnetic field 200, but opposite. A portion of the magnetic field 200 is shown in FIG. 6 as broken circular or oval rings. In contrast to the magnetic field 35 (generated by the inductor device) shown in FIG. 1C, the magnetic field 200 is substantially parallel to the surface 50 of the substrate 40, rather than perpendicular to (or otherwise intersect) the substrate 40. And since the magnetic field 200 and an induced magnetic field are substantially parallel to the surface 50, eddy current will be induced in the dielectric material of the interconnect structure 60. Little to no eddy current will be induced in the substrate 40. As such, the magnetic interaction between the coils 110-120 and the substrate 40 can be reduced, thereby resulting in a lower loss in the substrate.

Whereas transformers such as the transformer 20 of FIG. 1B can be referred to as having coplanar coils, the transformer 100 of FIG. 5 has vertically-wound coils and can be referred to as a vertically-oriented transformer. Stated differently, the coils 110-120 of the transformer 120 wind in a direction or orientation that is non-parallel to the surface 50 of the substrate 40. The transformer 100 also has variable metal width coils. For example, the width of the coil 110 can be several times greater than the width of the coil 120. Such vertical variable-width transformer of the present disclosure offers advantages over conventional transformers, it being understood that other embodiments may offer different advantages, and that no particular advantage is required for all embodiments.

One advantage offered by the transformer of the present disclosure is reduced consumption in chip area. As seen in FIG. 1B, a transformer similar to the transformer 20 and having lateral windings will demand a significant amount of chip area. In comparison, the transformer 100 implements its windings vertically. The coils are implemented with metal lines belonging to different metal layers interconnected together by vias. As such, the coils wind vertically, in planes oriented perpendicular to the surface of the substrate. The utilization of vertical space inside the interconnect structure reduces the need for the coils to occupy space horizontally. Therefore, valuable chip area can be conserved.

Another advantage offered by the transformer of the present disclosure is reduced losses in the substrate. In conventional transformers having lateral coil windings, the induced magnetic field is perpendicular to the substrate, which induces eddy currents in the substrate as well. The presence of eddy currents in the substrate results in loss in the substrate, which is undesirable. In comparison, for the transformer disclosed herein, the induced magnetic field is parallel to the substrate surface due to the vertical orientation of the coil windings. The parallel magnetic field in turn induces eddy currents that are substantially confined within the interconnect structure (and not in the substrate). Consequently, loss in the substrate can be substantially prevented or reduced.

Another advantage offered by the transformer of the present disclosure is its high impedance transformation. In conventional transformers having lateral coil windings, the primary coil and the secondary coil typically has a 1:1 turn ratio. The widths of the primary windings and the secondary windings are typically the same too. Thus, the induced current and voltage at the secondary coil is substantially the same as the current and voltage at the primary coil. In other words, the conventional transformer has very little "step up" or "step down" capabilities, and impedance transformation ratio may be close to 1:1.

In comparison, the variable metal width transformer of the present disclosure can have a secondary coil with a plurality of windings corresponding to each winding of the primary coil. This means that the current at the primary coil can be a plurality of times of the current at the secondary coil. In addition, the reduced width of the secondary coil increases the resistance of the secondary coil relative to the primary coil, which in turn also reduces the current at the secondary coil relative to the primary coil. Thus, the impedance transformation ratio may be much higher than conventional transformer devices.

To illustrate the discussions above, Table 1 below is used as an example.

TABLE 1

| Electrical Parameters | Conventional Transformer | Transformer disclosed herein |
|---|---|---|
| Current | $I_1/I_2 = (1*1)/1$ | $I_1/I_2 = (2*3)/1$ |
| Voltage | $V_1/V_2 = 1/(1*1)$ | $V_1/V_2 = 1/(2*3)$ |
| Impedance | $Z_1/Z_2 = [1/(1*1)]^2$ | $Z_1/Z_2 = [1/(2*3)]^2$ |

In the transformer correspond to Table 1, the secondary coil has double the number of windings as the primary coil (i.e., two turns for each turn of the primary coil). This results in a transformation ratio of 2. The secondary coil also has a metal width that is ⅓ of the metal width of the primary coil. This results in a transformation ratio of 3. Hence, whereas a conventional transformer may have a current transformation ratio of 1:1, the transformer herein can have a current transformation ratio of $I_1/I_2=2*3:1$ or 6:1. Similarly, whereas a conventional transformer may have a voltage transformation ratio of 1:1, the transformer herein can have a voltage transformation ratio of $V_1/V_2=1:2*3$ or 1:6. Since impedance Z=V/I, the impedance transformation ratio is effectively squared. In other words, whereas a conventional transformer may have an impedance transformation ratio of 1:1, the transformer herein can have an impedance transformation ratio of $Z_1/Z_2=[1/(2*3)]^2$ or 1:36. As such, to achieve a $Z_2$ of 108 ohms, $Z_1$ can be as low as 3 ohms.

Conversely, the primary coil and the secondary coil can be swapped to have a reverse transformation ratio, as shown in Table 2 below.

TABLE 2

| Electrical Parameters | Conventional Transformer | Transformer disclosed herein |
|---|---|---|
| Current | $I_1/I_2 = 1/(1*1)$ | $I_1/I_2 = 1/(2*3)$ |
| Voltage | $V_1/V_2 = (1*1)/1$ | $V_1/V_2 = (2*3)/1$ |
| Impedance | $Z_1/Z_2 = [(1*1)/1]^2$ | $Z_1/Z_2 = [(2*3)/1]^2$ |

The numbers of Table 1 and Table 2 represent the case of an ideal transformer. In a real world situation, the transformer may experience lower coupling factors due to losses and other concerns such as spacing. For example, for conventional transformers, the primary coil and the secondary coil may be implemented in a manner such that they are several metal layers apart, thereby resulting in a reduced coupling factor. In Comparison, with reference to FIG. 5, the primary coil and the secondary coil can be adjacent to each other. For example, interconnect line 132 of the coil 110 and the interconnect line 150 of the coil 120 are only one metal layer apart (i.e., the interconnect line 132 can be in the M6 layer, and the interconnect line 150 can be in the M5 layer immediately below the M6 layer). As such, stronger coupling can exist between the coils 110 and 120, thereby leading to an improved coupling factor compared to traditional transformers.

Another advantage offered by the transformer disclosed herein is its suitable usage in high frequency applications. The reduced losses in the substrate lead to a higher quality factor, which is important in high-frequency applications. Also, the metal widths can be adjusted in a suitable manner so as to operate the primary and secondary coils in a desired resonant frequency, which may be important in microwave circuit designs. Furthermore, the capability to step up or down the impedance by a high ratio is also desirable in high frequency applications.

According to various aspects of the present disclosure, the vertically-oriented coils discussed above with reference to FIG. 5 may also be used to implement other microelectronic components, for example inductor devices. Inductor devices have been widely used in circuit designs, for example as part of an inductor-capacitor (LC) tank. LC tanks may be used to implement circuit components such as a voltage-controlled oscillator (VCO). Conventional inductor devices been typically been implemented using laterally-oriented coils, which as discussed above tend to have excessive chip area consumption. As miniaturization of the IC devices continues, efficient utilization of chip area becomes more important. Moreover, the relatively long length of the coils may lead to higher electrical parasitics, which reduces the quality factor of the LC tank and is therefore undesirable.

Figure 7:
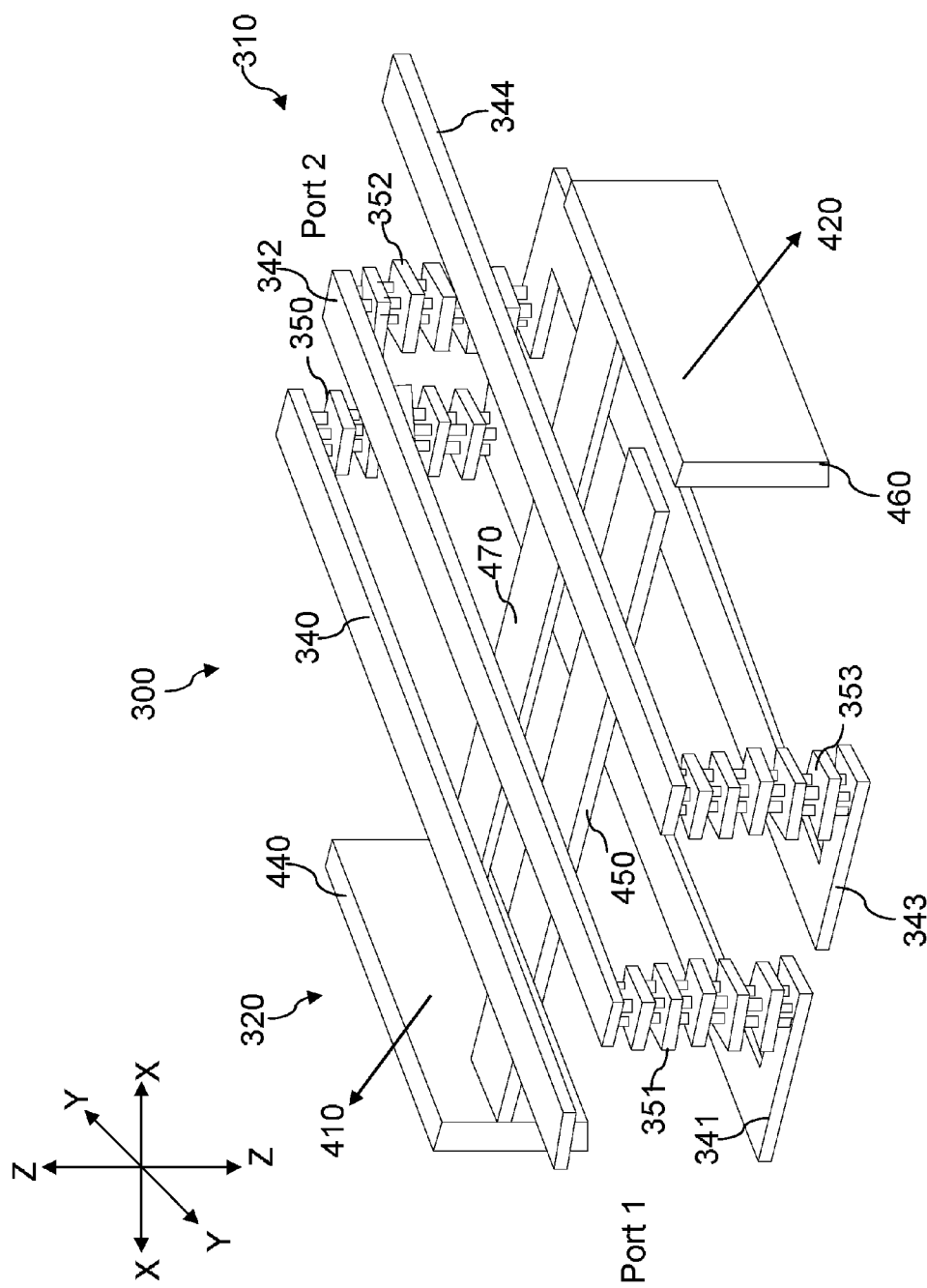
FIG. 7 is a perspective view of an inductor capacitor (LC) tank according to an embodiment.

The present disclosure discloses an inductor device that substantially overcomes the problems discussed above. Referring to FIG. 7, a fragmentary perspective view of an LC tank 300 is illustrated. The LC tank 300 is implemented within the interconnect structure 60 of FIG. 4. The LC tank 300 includes an inductor device 310 and a capacitor device 320. The inductor device 310 and the capacitor device 320 may be electrically coupled, for example in parallel or in series.

In the illustrated embodiment, the inductor device 310 includes interconnect lines 340-344 and via stacks 350-353. The interconnect lines 340-344 may each be implemented in an interconnect layer. In some embodiments, some of the interconnect lines 340-344 may be implemented in the same interconnect layer (for example, interconnect lines 341 and 343 may be implemented in the same interconnect layer). The via stacks 350-353 each include a plurality of vertically-aligned vias and conductive components.

The interconnect lines 340-341 are interconnected together by the via stack 350. The interconnect lines 341-342 are interconnected together by the via stack 351. The interconnect lines 342-343 are interconnected together by the via stack 352. The interconnect lines 343-344 are interconnected together by the via stack 353. A dielectric material (for example, ILD) otherwise separates these interconnect lines 340-344 and vias 350-354. The interconnect lines 340-344 and the via stacks 350-353 collectively make up the coil of the inductor device 310.

Port 1 of the inductor device 310 is defined by a distal end portion of the interconnect line 340, and port 2 of the inductor device 310 is defined by a distal end portion of the interconnect line 344. An electrical signal can propagate from port 1 to port (or vice versa) through the interconnect lines 340-344 and the via stacks 350-353. The inductance of the inductor device 310 may be adjusted by changing its number of coil windings or its material composition.

Similar to the coils of the transformer 100 discussed above (shown in FIG. 5), the inductor device 310 has a winding orientation or direction that intersects with the surface 50 of the substrate 40 (shown in FIG. 3). In other words, the coil of the inductor device 310 winds in an orientation that is non-parallel to the surface 50 of the substrate 40. In an embodiment, the winding orientation of the coil of the inductor device 310 is approximately perpendicular or orthogonal to the surface 50 of the substrate 40. Therefore, for reasons similar to those discussed above with reference to the transformer device 100, the vertical orientation of the inductor device 310 creates a magnetic field that is parallel to the surface 50 of the substrate 40, which induces eddy current mostly in the interconnect structure 60, rather in the substrate 40. Hence, the inductor device 310 has reduced loss in the substrate as well.

The capacitor device 320 includes an anode component 410 and a cathode component 420. The anode component 410 and the cathode component 420 respectively serve as anode and cathode terminals of the capacitor device 320, so that an electrical voltage can be applied through the anode and cathode terminals. Stated differently, when the capacitor device 320 is in operation (functioning as a capacitor), one voltage will be applied throughout the anode component 410, while a different voltage will be applied throughout the cathode component 420. The anode and cathode components 410 and 420 may be considered opposite electrodes or may be said to have different polarities. It is also understood that the relative positioning of the anode and cathode components 410 and 420 is not critical. For example, the anode and cathode components 410 and 420 may be rotated, flipped, or switched in other embodiments.

The dielectric material of the interconnect structure 60 serves as the dielectric between the anode and cathode electrodes of the capacitor device 320. In FIG. 7, the dielectric material separates and electrically isolates the various parts of the anode component 410 from the various parts of the cathode component 420. Depending on the need and function to be performed by the capacitor device 320, the dielectric material of the interconnect structure 100 can be carefully chosen so as to effect the desired capacitance. For example, the capacitance for a parallel plate capacitor can be calculated with the following equation:

$$C = \varepsilon_r \varepsilon_0 \frac{A}{d}$$

where C is the capacitance; A is the area of overlap of the two plates; $\in_r$ is the dielectric constant of the material between the plates; $\in_0$ is the electric constant ($\square_0 \approx 8.854 \times 10{-}12$ F m$^{-1}$); and d is the separation between the plates. As such, if a high capacitance capacitor is desired, the dielectric material of the interconnect structure can be chosen to have a high dielectric constant.

In the embodiment illustrated in FIG. 7, the anode component 410 includes a plate structure 440 and a laterally extending member 450 that is coupled to the plate structure 440, and the cathode component 420 includes a plate structure 460 and a laterally extending member 470 that is coupled to the plate structure 460. It is understood that the plate structures 440 and 460 may be schematic representations of stacks of metal lines and vias, rather than actual single plates. In an embodiment, the laterally extending members 450 and 570 are implemented as interconnect lines in the same or different interconnect layers.

In an embodiment, the members 450 and 470 are substantially parallel to the surface 50 of the substrate 40. The members 450 and 470 also extend in a direction that is non-parallel to the direction in which the interconnect lines 340-344 extend. Stated differently, the members 450 and 470 each directionally intersect the interconnect lines 340-344, though no physical contact is made. In an embodiment, the members 450 and 470 are each substantially perpendicular to the interconnect lines 340-344. In an embodiment, the members 450 and 470 are also disposed within or in between the interconnect lines 340-344. For example, in the illustrated embodiment, the interconnect lines 340, 342, and 344 are located in an interconnect layer above the interconnect layer or layers in which the members 450 and 470 are located, and the interconnect lines 341 and 343 are located in an interconnect layer below the interconnect layer or layers in which the members 450 and 470 are located. It may be said that the inductor device 310 and the capacitor device 320 are interdigitated with one another.

Figure 8:
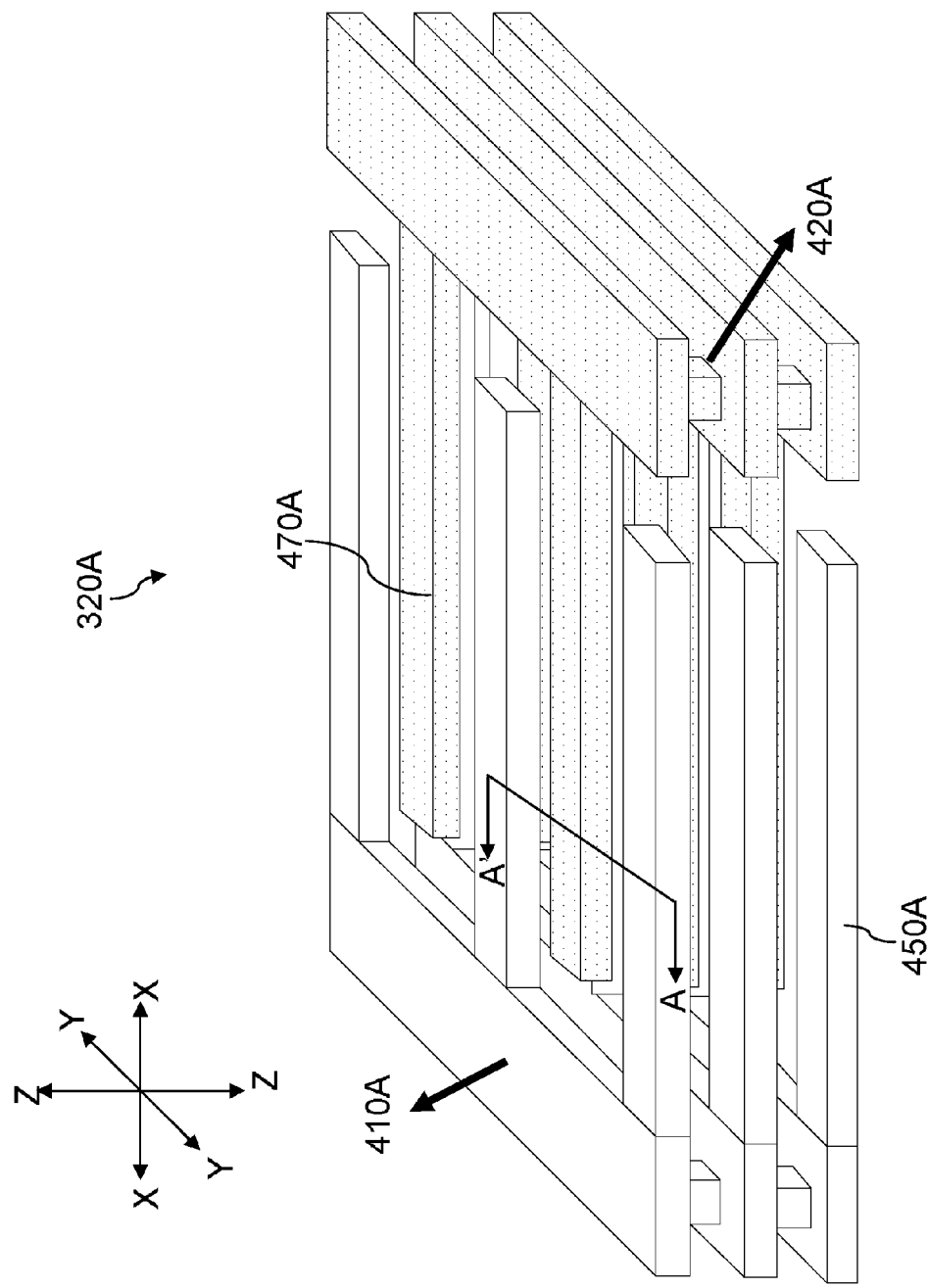
FIG. 8 is a perspective view of a capacitor of an LC tank according to an embodiment.

FIG. 8 is a perspective view of another embodiment of the capacitor device 320 of FIG. 7. In FIG. 8, the capacitor device 320A includes an anode component 410A and a cathode component 420A. The anode component 410A includes a plurality of laterally extending elongate members 450A, and the cathode component 420A includes a plurality of laterally extending elongate members 470A. In an embodiment, the elongate members 450A and 470A extend in a plane substantially parallel to the surface 50 of the substrate 40. The elongate members 450A and 470A may belong to a plurality of different metal layers of the interconnect structure 60. In the embodiment shown, these elongate members 450A are interdigitated in the Y-direction with the elongate members 470A so as to increase effective capacitance.

Figure 9:
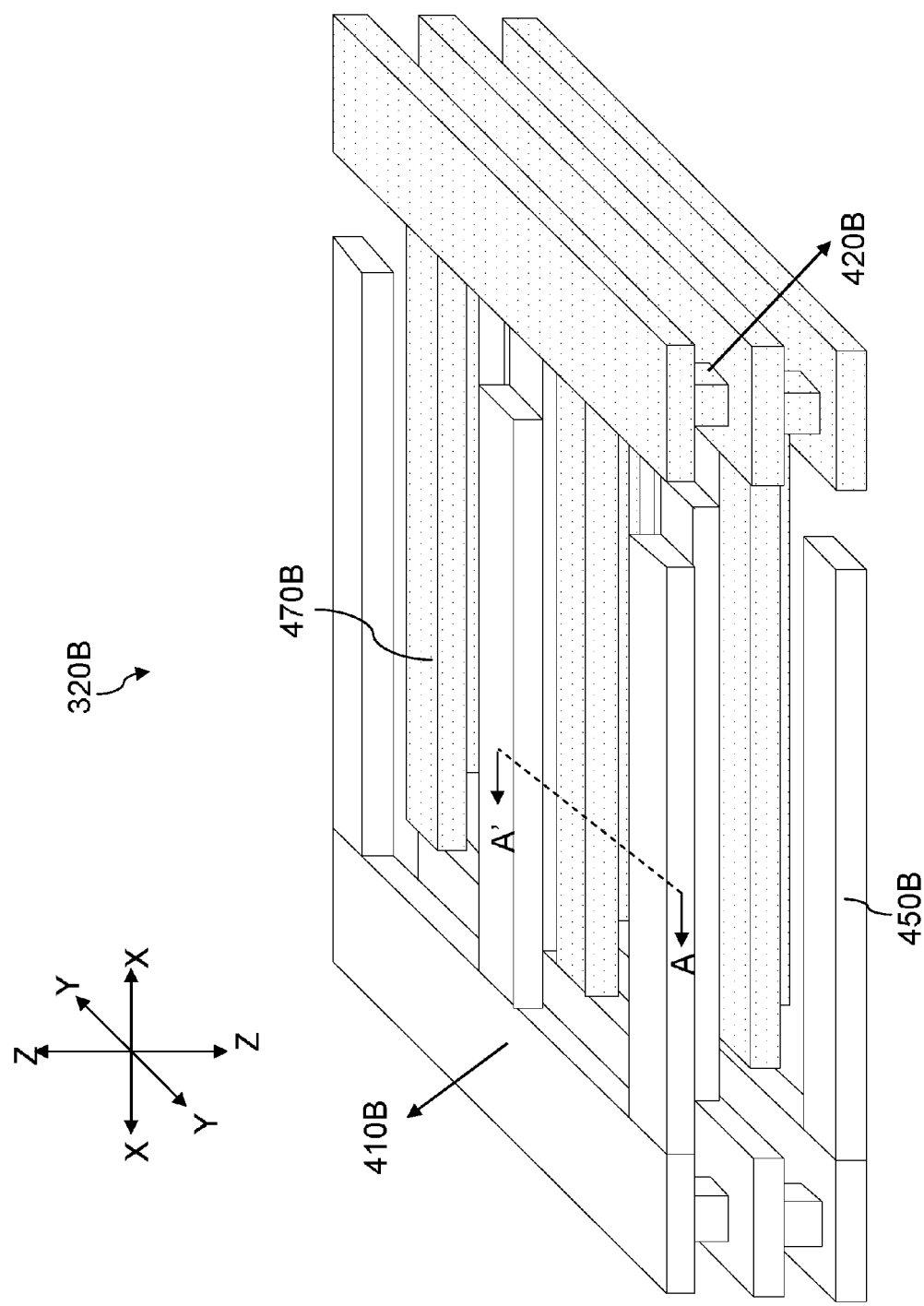
FIG. 9 is a perspective view of a capacitor of an LC tank according to an embodiment.

FIG. 9 is a perspective view of another embodiment of the capacitor device 320 of FIG. 7. In FIG. 9, the capacitor device 320B includes an anode component 410B and a cathode component 420B. The anode component 410B includes a plurality of laterally extending elongate members 450B, and the cathode component 420B includes a plurality of laterally extending elongate members 470B. In an embodiment, the elongate members 450B and 470B extend in a plane substantially parallel to the surface 50 of the substrate 40. The elongate members 450B and 470B may belong to a plurality of different metal layers of the interconnect structure 60. In the embodiment shown, these elongate members 450B are interdigitated in the Z-direction with the elongate members 470B so as to increase effective capacitance.

It is understood that the capacitor device 320 may be implemented differently in other embodiments. For example, the capacitor device 320 may be implemented using interdigitated structures as detailed in U.S. patent application Ser. No. 13/158,044, Titled "A VERTICAL INTERDIGITATED SEMICONDUCTOR CAPACITOR" and filed on Jun. 10, 2011, the content of which is hereby incorporated by reference in its entirety. In some other embodiments, another capacitor device may be implemented as a FinFET varactor having a metal gate.

The inductor device and the LC tank incorporating the inductor device of the present disclosure offer advantages over conventional inductors and conventional LC tanks. It is understood that other embodiments may offer different advantages, and that no particular advantage is required for all embodiments. One advantage offered by the inductor device is reduced loss in the substrate. As discussed above, the vertically-oriented (with respect to the surface 50 of the substrate 40) coils of the inductor device herein results in a magnetic field that is substantially parallel to the substrate, which induces eddy currents mostly in the interconnect structure 60, rather than in the substrate 40. Hence, the inductor device of the present disclosure is less lossy compared to conventional laterally-oriented inductor devices.

Another advantage offered by the inductor device of the present disclosure is less consumption of chip area. Since the coils of the inductor device herein winds vertically, the windings (each spanning several metal layers) can be located adjacent to one another. The usage of vertical space results in a more efficient utilization of valuable chip area.

Figure 11:
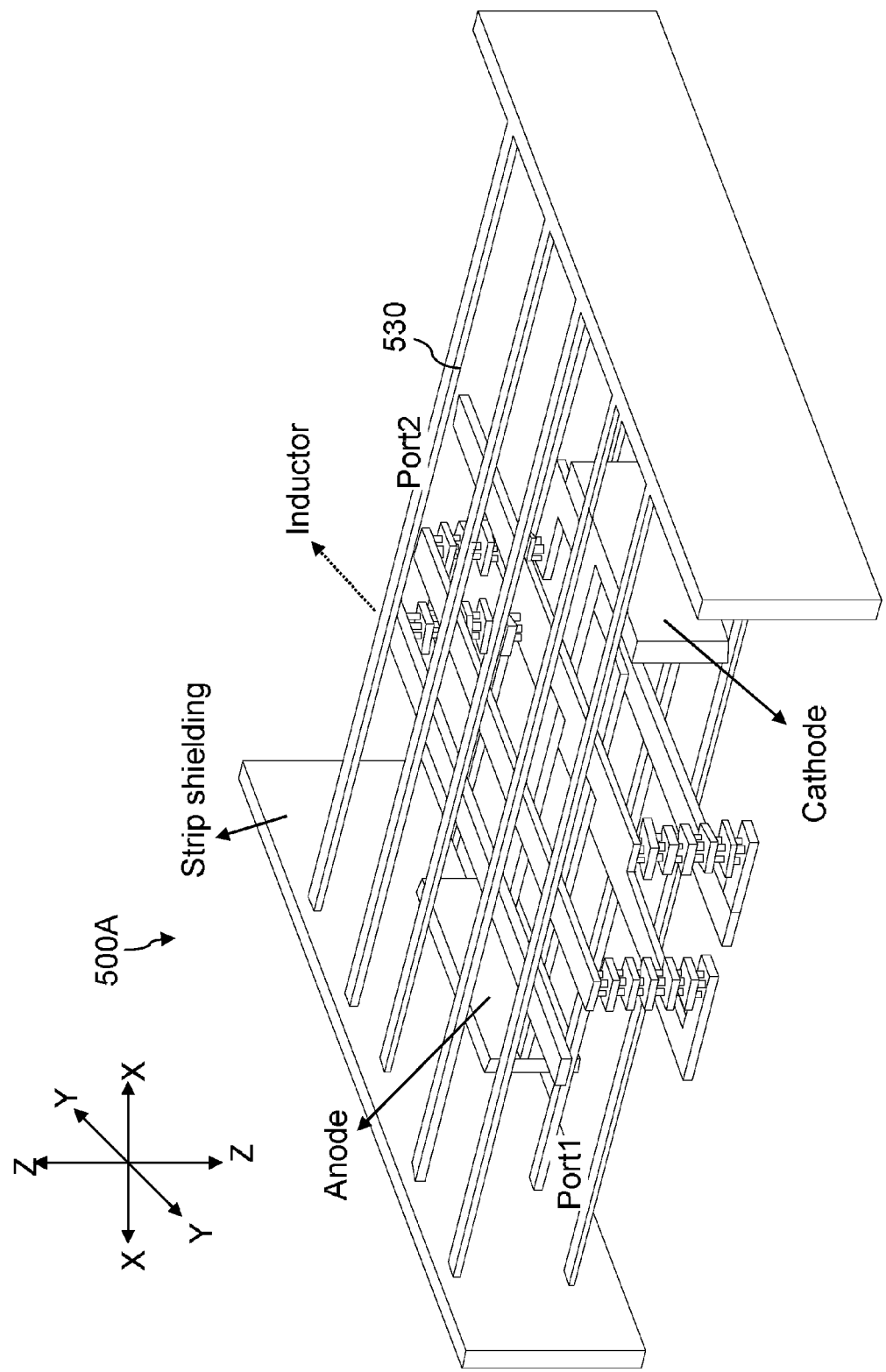
FIG. 11 is a perspective view of a shielding structure housing an LC tank therein according to an embodiment.

Yet another advantage offered by the inductor device with strip shielding (as shown in FIG. 11 later) of the present disclosure is lower thermal noise. Due at least in part to the vertical coil windings, the inductor device herein can achieve the same inductance value as a conventional inductor while using a shorter length coil. The shorter length coil leads to a lower parasitic resistance value of the inductor. The lower resistance value reduces thermal noise, which is correlated to 4 KTR, where K is Boltzmann's constant, T is a resistor's absolute temperature in Kelvins, and R is the resistor's resistance value in ohms. Therefore, the inductor device herein can achieve a lower thermal noise than conventional inductor devices. In addition, the reduced parasitic resistance increases the quality factor of the inductor device as well.

A further advantage offered by the LC tank with strip shielding (as shown in FIG. 11 later) is more precise resonant frequency adjustment. The LC tank disclosed herein defines the return path clearly. The inductance values of the inductor device can be flexibly adjusted by changing its windings. The resonant frequency of an LC tank is correlated to the inverse of the square root of (inductance of inductor×capacitance of capacitor). Thus, the flexibility of inductance adjustment means that the resonant frequency can be flexibility tuned as well. This may also reduce silicon tape-out time, which reduces fabrication costs and reduces time-to-market delays.

Figure 10:
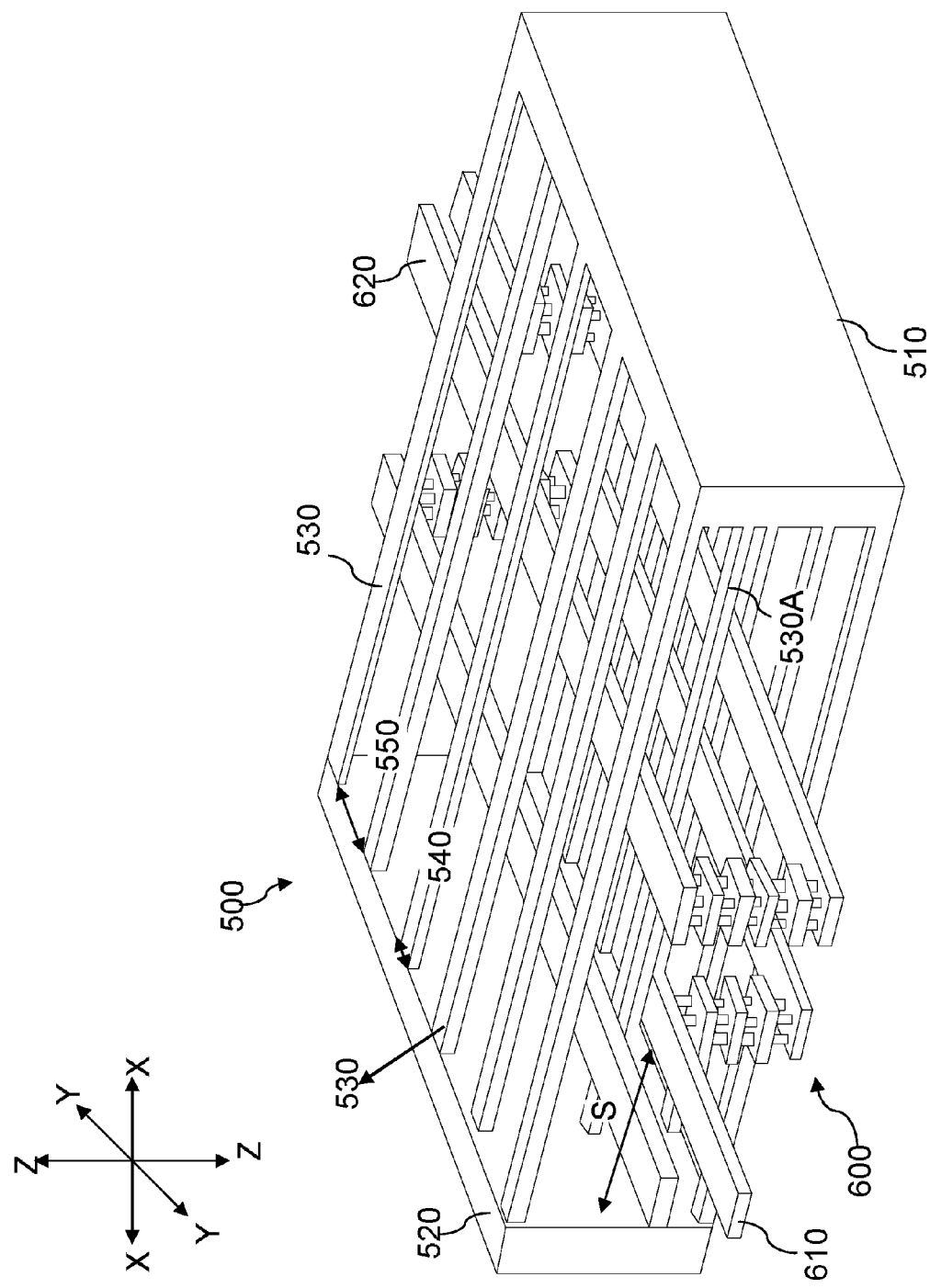
FIG. 10 is a perspective view of a shielding structure housing a transformer therein according to an embodiment.

In order to reduce noise and interference, electronic components such as the transformer device and the LC tank device discussed above may be shielded using a shielding structure according to the present disclosure. Referring to FIG. 10, a fragmentary perspective view of a shielding structure 500 is illustrated. The shielding structure 500 is implemented within the interconnect structure 60. The shielding structure 500 includes side portions 510 and 520. The side portions 510-520 are parallel to each other in the illustrated embodiment. Though they are shown as solid blocks, it is understood that the side portions 510-520 may each include a plurality of laterally extending interconnect lines interconnected together by vias.

The shielding structure 500 also includes a plurality of conductive members (also referred to as strip shielding lines) 530. The conductive members 530 extend in a direction that is different from the side portions 510-520. In an embodiment, the conductive members 530 are substantially parallel to the surface 50 of the substrate 40 and are substantially perpendicular to the side portions 510-520. According to some embodiments, the conductive members 530 may be implemented with interconnect lines of the interconnect structure 60.

In an embodiment, the conductive members 530 couple the oppositely-facing side portions 510-520 together. The conductive members 530 each have a width 540. In an embodiment, the width 540 is in a range from about 0.05 microns (urn) to about 10 um. The conductive members 530 are separated from adjacent conductive members by a spacing 550. In an embodiment, the spacing 550 is in a range from about 0.05 um to about 10 um. It is understood, however, that the minimum value can vary depending from the different technology node used.

The shielding structure 500 houses an electronic device 600 therein. In the illustrated embodiment, the electronic device 600 is a transformer device. In accordance with various aspects of the present disclosure discussed above, the transformer device 600 includes vertically-winding coils 610 and 620. The coils 610 and 620 each include interconnect lines from different interconnect layers. The conductive members 530 of the shielding structure extend in a direction that intersects with the direction in which the interconnect lines of the coils 610-620 extend. In an embodiment, the conductive members 530 and the interconnect lines of the coils 610-620 extend in directions that are perpendicular to each other.

A subset of the conductive members 530 is located in an interconnect layer above the coils 610-620, a subset of the conductive of the conductive members 530 is located in an interconnect layer below the coils 610-620. In that manner, the transformer device 600 is surrounded by the shielding structure 500. In addition, a subset of the conductive members 530 extends through openings formed by the coils 610 and 620. For example, conductive member 530A is located in an interconnect layer that is between the topmost (furthest away from the substrate surface) interconnect line and the bottommost (closest to the substrate surface) interconnect line of the coils 610-620. For example, if the topmost interconnect lines of the coils 610-620 are located in an M7 layer, and the bottommost interconnect line of the coils 610-620 are located in an M1 layer, then the conductive member 530A may be located in anyone of the layers between an M2 layer and an M6 layer.

The shielding structure 500 creates slow-wave features (or a slow-wave phenomenon), which help increase the immunity of the electronic device (such as the transformer 600) located inside the shielding structure 500 against noise and interference signals from surrounding devices. In other words, the slow-wave features created by the shielding structure 500 serve to better isolate the electronic device disposed therein. In general, a slow-wave phenomenon involves a deceleration of the propagation of electro-magnetic waves in a guided medium. Such deceleration can be achieved by implementing periodical shields to reduce the wavelength in a transmission line. Here, the conductive members 530 serve as the periodical shields that help create the slow-wave features. Also recall that the conductive members 530A extend through, or are surrounded by, the transformer device 600. The presence of these conductive members 530 enhances the slow-wave phenomenon, thereby further improving the electrical isolation offered by the shielding structure 500. It is also understood that the fact that the conductive members 530 are perpendicularly disposed with respect to the signal path (propagating along the coils 610-620, for example) helps reduce noise from being coupled to the signal paths.

FIG. 11 is a perspective view of an embodiment of the shielding structure discussed above. The shielding structure 500A houses an embodiment of the LC tank 300 as the electronic device. The shielding structure 500A includes a plurality of elongate conductive members 530A that extend in a direction perpendicular to that of the signal path of the inductor coils. Though not specifically illustrated, the shielding structure 500A may also include conductive members that extend through (or between) the coils of the inductor, so that a better slow-wave effect can be obtained to improve the performance of the shielding structure.

Though a transformer and an LC tank are used as an example of the electronic device 600 disposed inside the shielding structure 500, it is understood that other types of electronic devices may be implemented inside the shielding structure 500 in alternative embodiments. For example, the electronic device 600 inside the shielding structure 500 may include one or more inductors, one or more capacitors, one or more resistors, one or more transmission lines, or combinations thereof. In these alternative embodiments, the conductive members 530 of the shielding structure 500 may be perpendicular to the signal paths of the electronic devices therein, and a subset of the conductive members 530A may extend through (rather than above or below) the electronic devices. In this manner, the shielding structure 500 may provide good isolation to the electronic device therein against noise from surrounding structures.

Figure 12:
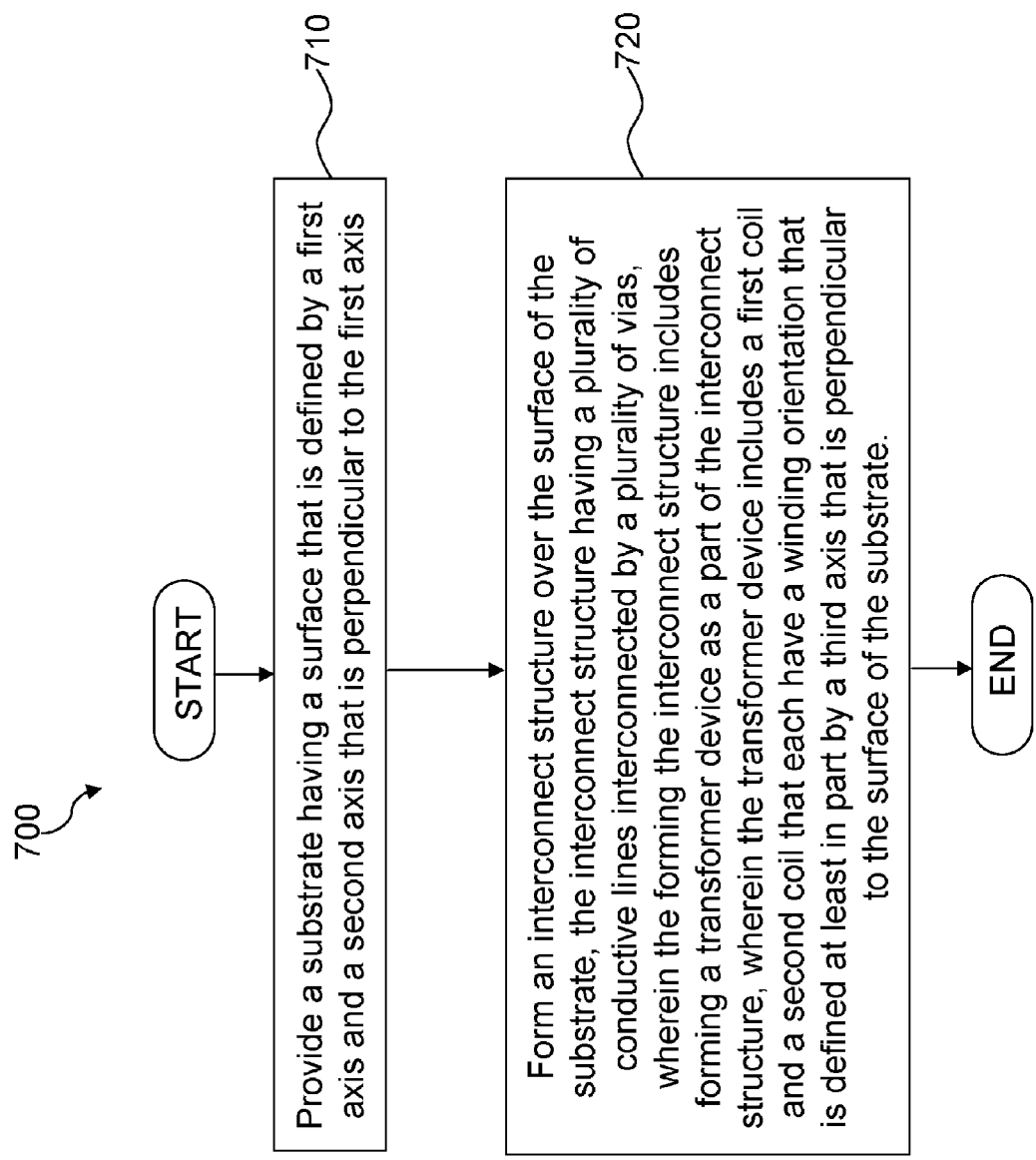
FIG. 12 is a flowchart illustrating a method of fabricating a transformer device according to an embodiment.

FIG. 12 illustrates a flowchart of a method 700 for fabricating a semiconductor device that includes a transformer device according to various aspects of the present disclosure. It is understood that the Figures discussed herein have been simplified for a better understanding of the inventive concepts of the present disclosure. Accordingly, it should be noted that additional processes may be provided before, during, and after the method 700, and that some other processes may only be briefly described herein. The method 700 includes block 710 in which a substrate is provided. The substrate has a surface that is defined by a first axis and a second axis that is perpendicular to the first axis. The method 20 includes block 720 in which an interconnect structure is formed over the surface of the substrate. The interconnect structure has a plurality of conductive lines interconnected by a plurality of vias. The formation of the interconnect structure includes forming a transformer device as a part of the interconnect structure. The transformer device includes a first coil and a second coil that each have a winding orientation that is defined at least in part by a third axis that is perpendicular to the surface of the substrate.

Figure 13:
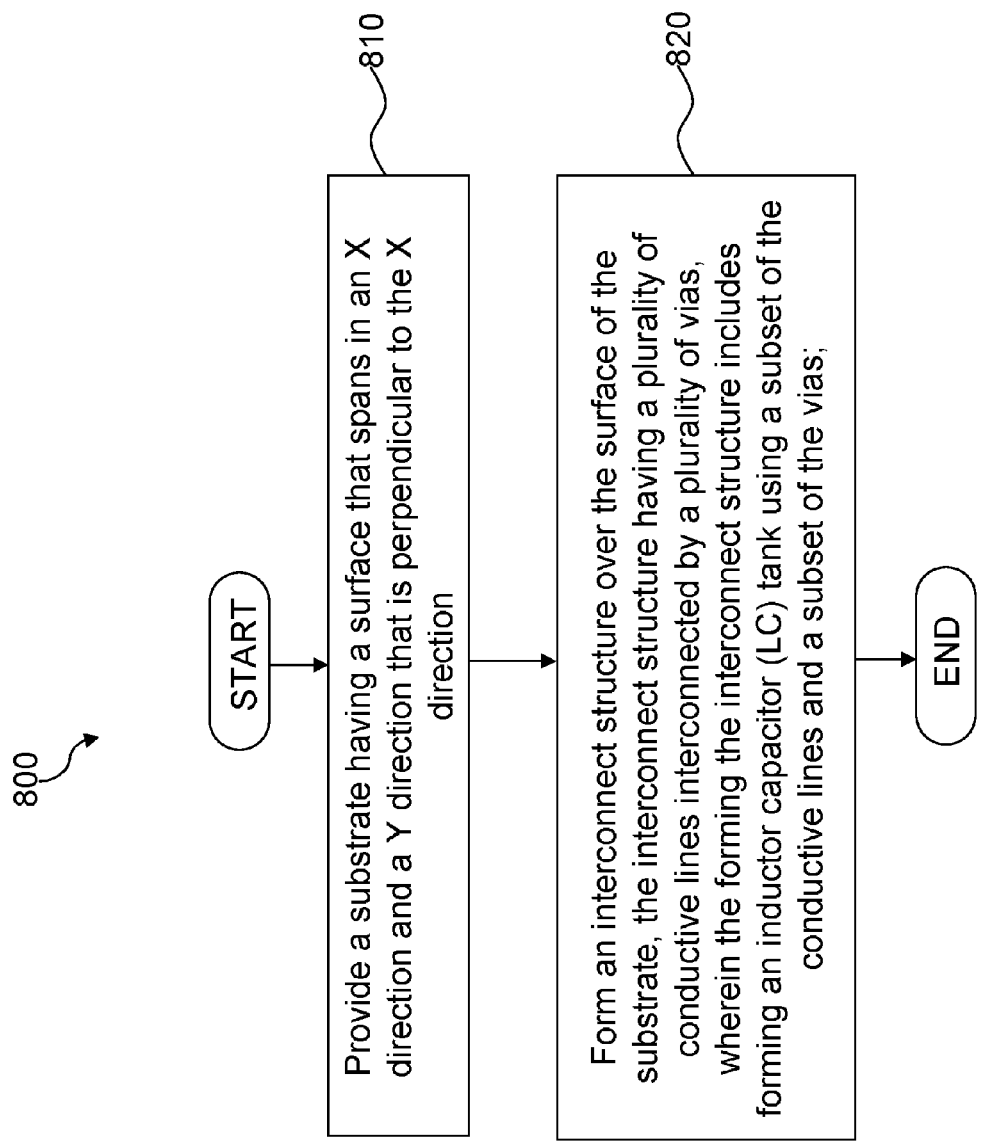
FIG. 13 is a flowchart illustrating a method of fabricating an LC tank device according to an embodiment.

FIG. 13 illustrates a flowchart of a method 800 for fabricating a semiconductor device that includes an LC tank device according to various aspects of the present disclosure. The method 800 includes block 810 in which a substrate is provided. The substrate has a surface that spans in an X direction and a Y direction that is perpendicular to the X direction. The method 800 includes block 820 in which an interconnect structure is formed over the surface of the substrate. The interconnect structure has a plurality of conductive lines interconnected by a plurality of vias. The interconnect structure is formed to includes an inductor capacitor (LC) tank. The LC tank is formed using a subset of the conductive lines and a subset of the vias. The LC tank includes an inductor that has a coil winding orientation that spans at least in part in a Z direction that is perpendicular to the X and Y directions. The LC tank includes a capacitor that has an anode component and a cathode component that is interdigitated with the anode component.

FIG. 14 illustrates a flowchart of a method 900 for fabricating a semiconductor device that includes a shielding structure according to various aspects of the present disclosure. The method 900 includes block 910 in which a substrate is provided. The method 900 includes block 920 in which an electronic device is formed over the substrate. The electronic device includes a first member and a second member that is spaced apart from the first member. The method 900 includes block 930 in which a shielding structure that surrounds the electronic device. The shielding structure includes a plurality of elongate strip lines. At least a subset of the elongate strip lines is disposed between the first member and the second member of the electronic device.

One of the broader forms of the present disclosure involves a semiconductor device. The semiconductor device includes a substrate having a surface that is defined by a first axis and a second axis that is perpendicular to the first axis. The semiconductor device includes a transformer disposed over the surface of the substrate. The transformer includes a first coil and a second coil. The first and second coils have respective winding orientations that are non-parallel to the surface of the substrate.

One of the broader forms of the present disclosure involves a semiconductor device. The semiconductor device includes a substrate that spans in an X-direction and a Y-direction that is orthogonal to the X-direction. The semiconductor device includes an interconnect structure formed over the substrate in a Z-direction that is orthogonal to both the X-direction and the Y-direction. The interconnect structure includes a plurality of metal lines interconnected together in the Z-direction by a plurality of vias. The interconnect structure contains a transformer device that includes a primary coil and a secondary coil. The primary coil and the secondary coil are each wound at least partially in the Z-direction.

One of the broader forms of the present disclosure involves a method of fabricating a semiconductor device. The method includes providing a substrate having a surface that is defined by a first axis and a second axis that is perpendicular to the first axis. The method includes forming an interconnect structure over the surface of the substrate, the interconnect structure having a plurality of conductive lines interconnected by a plurality of vias, wherein the forming the interconnect structure includes forming a transformer device as a part of the interconnect structure, wherein the transformer device includes a first coil and a second coil that each have a winding orientation that is defined at least in part by a third axis that is perpendicular to the surface of the substrate.

One of the broader forms of the present disclosure involves a semiconductor device. The semiconductor device includes a substrate having a surface that is defined by an X axis and a Y axis that is perpendicular to the X axis; an inductor disposed over the surface of the substrate, the inductor having a winding orientation that is defined at least in part by a Z axis that is perpendicular to the X axis and the Y axis; and a capacitor disposed over the substrate and adjacent to the inductor.

One of the broader forms of the present disclosure involves a semiconductor device. The semiconductor device includes a substrate having a horizontal surface; and an interconnect structure formed over the horizontal surface of the substrate, the interconnect structure including: an inductor coil that is wound substantially in a vertical plane that is orthogonal to the horizontal surface of the substrate; and a capacitor disposed proximate to the inductor coil, the capacitor having an anode component and a cathode component; wherein the inductor coil and the capacitor each include a plurality of horizontally extending elongate members.

One of the broader forms of the present disclosure involves a method of fabricating a semiconductor device. The method includes: providing a substrate having a surface that spans in an X direction and a Y direction that is perpendicular to the X direction; and forming an interconnect structure over the surface of the substrate, the interconnect structure having a plurality of conductive lines interconnected by a plurality of vias, wherein the forming the interconnect structure includes forming an inductor capacitor (LC) tank using a subset of the conductive lines and a subset of the vias; wherein: the LC tank includes an inductor that is formed to have a coil winding orientation that spans at least in part in a Z direction that is perpendicular to the X and Y directions; and the LC tank includes a capacitor that is formed to have an anode component and a cathode component that is interdigitated with the anode component.

One of the broader forms of the present disclosure involves a semiconductor device. The semiconductor device includes: a substrate; an electronic device positioned over the substrate, the electronic device including an opening; and a shielding device positioned over the substrate and surrounding the electronic device, the shielding device including a plurality of elongate members, a subset of which extend through the opening of the electronic device; wherein at least one of the electronic device and the shielding device is formed in an interconnect structure positioned over the substrate.

One of the broader forms of the present disclosure involves a semiconductor device. The semiconductor device includes: a substrate; an electronic device disposed above the substrate, the electronic device including an elongate first component and an elongate second component that extend in a first direction and a second directions, respectively, the second component being disposed above the second component; and a shielding structure disposed over the substrate and shields the electronic device therein, the shielding structure including a plurality of strip lines that each extend in a direction non-parallel to the first and second directions; wherein: a first subset of strip lines are disposed below the first component of the electronic device; a second subset of strip lines are disposed above the first component of the electronic device and below the second component of the electronic device; and a third subset of strip lines are disposed above the second component of the electronic device.

One of the broader forms of the present disclosure involves a method of fabricating a semiconductor device. The method includes: providing a substrate; forming an electronic device over the substrate, the electronic device including a first member and a second member that is spaced apart from the first member; and forming a shielding structure that surrounds the electronic device, the shielding structure including a plurality of elongate strip lines; wherein at least a subset of the elongate strip lines are disposed between the first member and the second member of the electronic device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
    a substrate;
    an electronic device positioned over the substrate, the electronic device including an opening; and
    a shielding device positioned over the substrate and surrounding the electronic device, the shielding device including a plurality of elongate members, a subset of which extend through the opening of the electronic device;
    wherein:
    at least one of the electronic device and the shielding device is formed in an interconnect structure positioned over the substrate;
    the interconnect structure includes a plurality of metal layers that each contain a plurality of metal lines;
    the electronic device includes first and second components disposed in first and second metal layers, respectively, the first and second metal layers being vertically separated by the opening; and
    the subset of the elongate members of the shielding device is disposed in a third metal layer between the first and second metal layers.

2. The semiconductor device of claim 1, wherein the opening of the electronic device is formed by a coil that has a winding orientation perpendicular to a surface of the substrate on which the interconnect structure is formed.

3. The semiconductor device of claim 2, wherein the coil extends in a direction perpendicular to a direction in which the elongate members of the shielding structure extend.

4. The semiconductor device of claim 1, wherein the elongate members extend parallel to one another.

5. The semiconductor device of claim 1, wherein the electronic device includes a transformer having a primary coil and a secondary coil that are each wound in a plane orthogonal to a surface of the substrate, the subset of the elongate members of the shielding device extending through the primary and secondary coils.

6. The semiconductor device of claim 5, wherein the primary coil and secondary coil have different coil widths.

7. The semiconductor device of claim 1, wherein the electronic device includes an inductor capacitor (LC) tank that contains a vertically wound inductor coil and an interdigitated capacitor.

8. A semiconductor device, comprising:
    a substrate;
    an electronic device disposed above the substrate, the electronic device including an elongate first component that extends in a first direction and an elongate second component that extends in a second direction, the second component being disposed above the first component; and
    a shielding structure disposed over the substrate and shields the electronic device therein, the shielding structure including a plurality of strip lines that each extend in a direction non-parallel to the first and second directions;
    wherein:
    a first subset of strip lines are disposed below the first component of the electronic device;
    a second subset of strip lines are disposed above the first component of the electronic device and below the second component of the electronic device; and
    a third subset of strip lines are disposed above the second component of the electronic device.

9. The semiconductor device of claim 8, wherein:
    the first and second directions are substantially the same; and
    the strip lines of the shielding structure extend substantially perpendicularly with respect to the first and second directions.

10. The semiconductor device of claim 8, wherein the strip lines of the shielding structure are conductive.

11. The semiconductor device of claim 8, wherein the electronic device and the shielding structure are implemented in an interconnect structure disposed over the substrate, the interconnect structure containing a plurality of interconnect layers.

12. The semiconductor device of claim 11, wherein:
    the plurality of interconnect layers include first, second, third, fourth, and fifth interconnect layers;
    the first interconnect layer is located closest to the substrate among the first, second, third, fourth, and fifth interconnect layers, the first subset of strip lines being disposed in the first interconnect layer;
    the second interconnect layer is located farther away from the substrate than the first interconnect layer, the first component of the electronic device being disposed in the second interconnect layer;
    the third interconnect layer is located farther away from the substrate than the second interconnect layer, the second subset of strip lines being disposed in the third interconnect layer;

the fourth interconnect layer is located farther away from the substrate than the third interconnect layer, the second component of the electronic device being disposed in the fourth interconnect layer; and the fifth interconnect layer is located farthest from the substrate among the first, second, third, fourth, and fifth interconnect layers, the third subset of strip lines being disposed in the fifth interconnect layer.

13. The semiconductor device of claim 8, wherein the electronic device includes a transformer that has a first coil and a second coil, the first and second coils each having a winding orientation that is orthogonal to a surface of the substrate over which the electronic device is disposed.

14. The semiconductor device of claim 8, wherein the electronic device includes an inductor capacitor (LC) tank, the LC tank including:

an inductor coil that is wound in a plane perpendicular to the surface of the substrate; and a capacitor that includes interdigitated anode and cathode components.

15. A semiconductor device, comprising:

a substrate;

an interconnect structure disposed over the substrate, the interconnect structure including a plurality of interconnect layers that each contain a plurality of interconnect elements;

a winding coil that includes at least two interconnect elements that belong to different interconnect layers, wherein an opening is defined by the winding coil; and a shielding structure disposed over the substrate, the shielding structure including a plurality of elongate members, wherein a first subset of the elongate members are disposed over an uppermost portion of the winding coil, wherein a second subset of the elongate members are disposed below a bottommost portion of the winding coil, and a third subset of the elongate members are disposed between the uppermost and bottommost portions of the winding coil and extend through the opening of the winding coil.

16. The semiconductor device of claim 15, wherein the winding coil is wound perpendicularly with respect to a planar surface of the substrate.

17. The semiconductor device of claim 15, wherein the winding coil is a part of a transformer device or a part of an inductor device.

18. The semiconductor device of claim 15, wherein the winding coil is a first winding coil, and wherein the semiconductor device further comprises a second winding coil that includes at least two further interconnect elements that belong to different interconnect layers, wherein a further opening is defined by the second winding coil, and wherein the third subset of the elongate members of the shielding structure extend through the further opening of the second winding coil.

19. The semiconductor device of claim 18, wherein the first winding coil and the second winding coil have different coil dimensions.

20. The semiconductor device of claim 15, wherein the interconnect elements of the winding coil extend in a first horizontal direction, and wherein the third subset of the elongate members of the shielding structure extend in a second horizontal direction that is perpendicular to the first horizontal direction.

* * * * *